United States Patent [19]
Hardwick et al.

[11] Patent Number: 5,247,579
[45] Date of Patent: Sep. 21, 1993

[54] METHODS FOR SPEECH TRANSMISSION

[75] Inventors: John C. Hardwick, Somerville; Jae S. Lim, Winchester, both of Mass.

[73] Assignee: Digital Voice Systems, Inc., Burlington, Mass.

[21] Appl. No.: 802,142

[22] Filed: Dec. 3, 1991

Related U.S. Application Data

[63] Continuation-in-part of Ser. No. 624,878, Dec. 5, 1990.
[51] Int. Cl.$^5$ .............................................. G10L 9/00
[52] U.S. Cl. ................................ 381/40; 381/36; 381/37; 371/5.1; 371/37.4; 371/39.1
[58] Field of Search ................... 371/5.1, 5.2, 37.4, 371/37.7, 37.8, 37.9, 38.1, 39.1; 381/49, 50

[56] References Cited

U.S. PATENT DOCUMENTS

| | | | |
|---|---|---|---|
| 3,982,070 | 9/1976 | Flanagan | 381/51 |
| 4,276,647 | 6/1981 | Thacker et al. | 371/39.1 |
| 4,648,091 | 3/1987 | Gajjar | 371/37.4 |
| 4,744,086 | 5/1988 | Komly et al. | 371/39.1 |
| 5,007,094 | 4/1991 | Hsueh et al. | 381/49 |
| 5,023,910 | 6/1991 | Thomson | 381/37 |
| 5,036,515 | 7/1991 | Freeburg | 371/5.1 |
| 5,081,681 | 1/1992 | Hardwick et al. | 381/37 |

OTHER PUBLICATIONS

Digital Voice Systems Inc. "In Marsat-M Voice Coder" Version 1.1 Dec. 5, 1990.
Campbell et al., "The New 4800 bps Voice Coding Standard," Mil Speech Tech Conference, Nov. 1989.
Chen et al., "Real-Time Vector APC Speech Coding at 4800 bps with Adaptive Postfiltering," Proc. ICASSP 1987, pp. 2185-2188.
Griffin, et al., "Multiband Excitation Vocoder," IEEE TASSP, vol. ASSP36, No. 8, Aug. 1988, pp. 1223-1235.
Hardswick, "A 4.8 kbps Multi-Band Excitation Speech Coder," ICASSP 85, pp. 945-948, Tampa, Fla. Apr. 11-14, 1988.
Jayant et al., "Adaptive Postfiltering of 16 kb/s-ADPCM Speech," Proc. ICASSP 86, pp. 829-832, Tokyo Japan, Apr. 13-20, 1986.
Makhoul et al., "Vector Quantization in Speech Coding," Proc. IEEE, 1985, pp. 1551-1588.
McAulay et al., "Speech Analysis/Synthesis Based on a Sinusoidal Representation," IEEE TASSP, vol. ASSP34, No. 4, Aug. 1986, pp. 744-754.
Rahikka et al., "Celp Coding for Land Mobile Radio Applications," Proc. ICASSP 90, pp. 465-468, Albequerque, N.M., Apr. 3-6, 1990.
Quateri et al., "Speech Transformations Based on a Sinusoidal Representation," IEEE TASSP, vol. ASSP34, No. 6, Dec. 1986, pp. 1449-1986.
Griffin, "Multiband Excitation Vocoder," Ph.D. Thesis, MIT, 1987.
Griffin, "A New Model-Based Speech Analysis/Synthesis System," Proc. ICASSP 85, pp. 513-516, Tampa, Fla., Mar. 26-29, 1985.
Hardwick, "A 4.8 kbps Multi-Band Excitation Speech Coder," S.M. Thesis, MIT, May 1988.
McAuley et al., "Mid-Rate Coding Based on a Sinusoidal Representation of Speech," Proc. ICASSP 85, pp. 945-948, Tampa, Fla. Mar. 26-29, 1985.
J. L. Flanagan, "Speech Analysis, Synthesis and Perception," Springer-Verlag, 1972, pp. 378-386.
Griffin et al, "A High Quality 9.6 kbps Speech Coding System" Proc. ICASSP 86, pp. 125-128, Tokyo, Japan, Apr. 13-20, 1986.
Jayant et al., Digital Coding of Waveforms, Prentice-Hall, Englewood Cliffs, N.J., 1984.
Levesque et al., Error-Control Techniques for Digital Communication, Wiley, 1985.

*Primary Examiner*—Dale M. Shaw
*Assistant Examiner*—Kee M. Tung
*Attorney, Agent, or Firm*—Fish & Richardson

[57] ABSTRACT

The performance of speech coding in the presence of bit errors is improved. The quantized parameter bits are grouped into several categories according to their sensitivity to bit errors. More effective error correction codes are used to encode the most sensitive parameter bits, while less effective error correction codes are used to encode the less sensitive parameter bits. This method improves the efficiency of the error correction and improves the performance if the total bit rate is limited. The perceived quality of coded speech is improved. A smoothed spectral envelope is created in the frequency domain. The ratio between the actual spectral envelope and the smoothed spectral envelope is used to enhance the spectral envelope. This reduces distortion which is contained in the spectral envelope.

18 Claims, 2 Drawing Sheets

METHODS FOR SPEECH TRANSMISSION

This application is a continuation-in-part of our co-pending application Ser. No. 07/624,878 filed Dec. 5, 1990. This invention relates to methods for quantizing speech and for preserving the quality of speech during the presence of bit errors.

BACKGROUND OF THE INVENTION

Relevant publications include: J. L. Flanagan, Speech Analysis, Synthesis and Perception, Springer-Verlag, 1972, pp. 378-386, (discusses phase vocoder-frequency-based speech analysis-synthesis system); Quatieri, et al., "Speech Transformations Based on a Sinusoidal Representation", IEEE TASSP, Vol, ASSP34, No. 6, December 1986, pp. 1449-1986, (discusses analysis-synthesis technique based on a sinusoidal representation); Griffin, "Multiband Excitation Vocoder", Ph.D. Thesis, M.I.T, 1987, (discusses an 8000 bps Multi-Band Excitation speech coder); Griffin, et al., "A High Quality 9.6 kbps Speech Coding System", Proc. ICASSP 86, pp. 125-128, Tokyo, Japan, Apr. 13-20, 1986, (discusses a 9600 bps Multi-Band Excitation speech coder); Griffin, et al., "A New Model-Based Speech Analysis/Synthesis System", Proc. ICASSP 85, pp. 513-516, Tampa, Fla., Mar. 26-29, 1985, (discusses Multi-Band Excitation speech model); Hardwick, "A 4.8 kbps Multi-Band Excitation Speech Coder", S.M. Thesis, M.I.T, May 1988, (discusses a 4800 bps Multi-Band Excitation speech coder); McAulay et al., "Mid-Rate Coding Based on a Sinusoidal Representation of Speech", Proc. ICASSP 85, pp. 945-948, Tampa, Fla., Mar. 26-29, 1985, (discusses the sinusoidal transform speech coder); Campbell et al., "The New 4800 bps Voice Coding Standard", Mil Speech Tech Conference, Nov. 1989, (discusses error correction in low rate speech coders); Campbell et al., "CELP Coding for Land Mobile Radio Applications", Proc. ICASSP 90, pp. 465-468, Albequerque, N. Mex. Apr. 3-6, 1990, (discusses error correction in low rate speech coders); Levesque et al., *Error-Control Techniques for Digital Communication*, Wiley, 1985, pp. 157-170, (discusses error correction in general); Jayant et al., *Digital Coding of Waveforms*, Prentice-Hall, 1984, (discusses quantization in general); Makhoul, et.al. "Vector Quantization in Speech Coding", Proc. IEEE, 1985, pp. 1551-1588, (discusses vector quantization in general); Digital Voice Systems, Inc., "INMARSAT-M Voice Coder", Version 1.1, Dec. 5, 1990, (discusses 6.4 kbps IMBE speech coder for INMARSAT-M standard), Jayant et al., "Adaptive Postfiltering of 16 kb/s-ADPCM Speech", Proc. ICASSP 86, pp. 829-832, Tokyo, Japan, Apr. 13-20, 1986, (discusses adaptive postfiltering of speech). The contents of these publications are incorporated herein by reference.

The problem of speech coding (compressing speech into a small number of bits) has a large number of applications, and as a result has received considerable attention in the literature. One class of speech coders (vocoders) which have been extensively studied and used in practice is based on an underlying model of speech. Examples from this class of vocoders include linear prediction vocoders, homomorphic vocoders, sinusoidal transform coders, multi-band excitation speech coders, improved multi-band excitation speech coders and channel vocoders. In these vocoders, speech is characterized on a short-time basis through a set of model parameters. The model parameters typically consist of some combination of voiced/unvoiced decisions, voiced/unvoiced probability measure, pitch period, fundamental frequency, gain, spectral envelope parameters and residual or error parameters. For this class of speech coders, speech is analyzed by first segmenting speech using a window such as a Hamming window. Then, for each segment of speech, the model parameters are estimated and quantized. The quantized model parameters may be combined with additional error correction data and then transmitted. In order to reconstruct speech, the quantized model parameters are used to synthesize speech using the speech model.

In some speech coding applications such as communications, speech coding is used to reduce the amount of data that must be transmitted. In this case, the received bits may differ from the transmitted bits due to noise in the transmission channel. This problem also exists in other applications such as speech storage where bit errors are caused by noise and other limitations in the storage medium. In these instances the presence of bit errors in the speech data may cause the synthesized speech to suffer significant quality degradation.

One approach to combat this problem is to use error correction codes or error detection codes. In this approach, the bits representing the speech model parameters are converted to another set of bits which are more robust to bit errors. The use of error correction or detection codes typically increases the number of bits which must be transmitted or stored. The number of extra bits which must be transmitted is usually related to the robustness of the error correction or detection code. In most applications, it is desirable to minimize the total number of bits which are transmitted or stored. In this case the error correction or detection codes must be selected to maximize the overall system performance.

Another problem in this class of speech coding systems is that limitations in the estimation of the speech model parameters may cause quality degradion in the synthesized speech. Subsequent quantization of the model parameters induces further degradation. This degradation can take the form of reverberant or muffled quality to the synthesized speech. In addition background noise or other artifacts may be present which did not exist in the original speech. This form of degradation occurs even if no bit errors are present in the speech data, however bit errors can make this problem worse. Typically speech coding systems attempt to optimize the parameter estimators and parameter quantizers to minimize this form of degradation. Other systems attempt to reduce the degradations by post-filtering. In post-filtering the output speech is filtered in the time domain with an adaptive all-pole filter to sharpen the format peaks. This method does not allow fine control over the spectral enhancement process and it is computationally expensive and inefficient for frequency domain speech coders.

The invention described herein applies to many different speech coding methods, which include but are not limited to linear predictive speech coders, channel vocoders, homomorphic vocoders, sinusoidal transform coders, multi-band excitation speech coders and improved multiband excitation (IMBE) speech coders. For the purpose of describing this invention in detail, we use the 6.4 kbps IMBE speech coder which has recently been standardized as part of the INMARSAT-M (International Marine Satellite Organization) satellite communication system. This coder uses a robust speech model which is referred to as the Multi-Band Excitation (MBE) speech model.

The MBE speech model was developed by Griffin and Lim in 1984. This model uses a more flexible representation of the speech signal than traditional speech models. As a consequence it is able to produce more natural sounding speech, and it is more robust to the presence of acoustic background noise. These properties have allowed the MBE speech model to be used for high quality low-rate speech coders.

Let s(n) denote a discrete speech signal obtained by sampling an analog speech signal. In order to focus attention on a short segment of speech over which the model parameters are assumed to be constant, the signal s(n) is multiplied by a window w(n) to obtain a windowed speech segment or frame, $s_w(n)$. The speech segment $s_w(n)$ is modelled as the response of a linear filter $h_w(n)$ to some excitation signal $e_w(n)$. Therefore, $S_w(\omega)$, the Fourier Transform of $s_w(n)$, can be expressed as $$S_w(\omega) = H_w(\omega) E_w(\omega) \qquad (1)$$

where $H_w(\omega)$ and $E_w(\omega)$ are the Fourier Transforms of $h_w(n)$ and $e_w(n)$, respectively. The spectrum $H_w(\omega)$ is often referred to as the spectral envelope of the speech segment.

In traditional speech models speech is divided into two classes depending upon whether the signal is mostly periodic (voiced) or mostly noise-like (unvoiced). For voiced speech the excitation signal is a periodic impulse sequence, where the distance between impulses is the pitch period. For unvoiced speech the excitation signal is a white noise sequence.

In traditional speech models each speech segment is classified as either entirely voiced or entirely unvoiced. In contrast the MBE speech model divides the excitation spectrum into a number of non-overlapping frequency bands and makes a voiced or unvoiced (V/UV) decision for each frequency band. This approach allows the excitation signal for a particular speech segment to be a mixture of periodic (voiced) energy and aperiodic (unvoiced) energy. This added flexibility in the modelling of the excitation signal allows the MBE speech model to produce high quality speech and to be robust to the presence of background noise.

Speech coders based on the MBE speech model use an algorithm to estimate a set of model parameters for each segment of speech. The MBE model parameters consist of a fundamental frequency, a set of V/UV decisions which characterize the excitation signal, and a set of spectral amplitudes which characterize the spectral envelope. Once the MBE model parameters have been estimated for each segment, they are quantized and transmitted to the decoder. The decoder then reconstructs the model parameters and synthesizes a speech signal from the MBE model parameters

TABLE 1

| Bit Allocation Among Model Parameters | |
|---|---|
| Parameter | Number of Bits |
| Fundamental Frequency | 8 |
| Voiced/Unvoiced Decisions | $\hat{K}$ |
| Spectral Amplitudes | 75-$\hat{K}$ |

Efficient methods for quantizing the MBE model parameters have been developed. These methods are capable of quantizing the model parameters at virtually any bit rate above 2 kbps. The 6.4 kbps IMBE speech coder used in the INMARSAT-M satellite communication system uses a 50 Hz frame rate. Therefore 128 bits are available per frame. Of these 128 bits, 45 bits are reserved for forward error correction. The remaining 83 bits per frame are used to quantize the MBE model parameters, which consist of a fundamental frequency $\hat{\omega}_0$, a set of V/UV decisions $\hat{v}_k$ for $1 \leq k \leq \hat{K}$, and a set of spectral amplitudes $\hat{M}_l$ for $1 \leq l \leq \hat{L}$. The values of $\hat{K}$ and $\hat{L}$ vary depending on the fundamental frequency of each frame. The 83 available bits are divided among the model parameters as shown in Table 1.

The fundamental frequency is quantized by first converting it to its equivalent pitch period using Equation (2).

$$\hat{P}_0 = \frac{2\pi}{\hat{\omega}_0} \qquad (2)$$

The value of $\hat{P}_0$ is typically restricted to the range $20 \leq \hat{P}_0 \leq 120$ assuming an 8 kHz sampling rate. In the 6.4 kbps IMBE system this parameter is uniformly quantized using 8 bits and a step size of 0.5. This corresponds to a pitch accuracy of one half sample.

The $\hat{K}$ V/UV decisions are binary values. Therefore they can be encoded using a single bit per decision. The 6.4 kbps system uses a maximum of 12 decisions, and the width of each frequency band is equal to $3\hat{\omega}_0$. The width of the highest frequency band is adjusted to include frequencies up to 3.8 kHz.

The spectral amplitudes are quantized by forming a set of prediction residuals. Each prediction residual is the difference between the logarithm of the spectral amplitude for the current frame and the logarithm of the spectral amplitude representing the same frequency in the previous speech frame. The spectral amplitude prediction residuals are then divided into six blocks each containing approximately the same number of prediction residuals. Each of the six blocks is then transformed with a Discrete Cosine Transform (DCT) and the D.C. coefficients from each of the six blocks are combined into a 6 element Prediction Residual Block Average (PRBA) vector. The mean is subtracted from the PRBA vector and quantized using a 6 bit non-uniform quantizer. The zero-mean PRBA vector is then vector quantized using a 10 bit vector quantizer. The 10 bit PRBA codebook was designed using a k-means clustering algorithm on a large training set consisting of zero-mean PRBA vectors from a variety of speech material. The higher-order DCT coefficients which are not included in the PRBA vector are quantized with scalar uniform quantizers using the 59-$\hat{K}$ remaining bits. The bit allocation and quantizer step sizes are based upon the long-term variances of the higher order DCT coefficients.

There are several advantages to this quantization method. First, it provides very good fidelity using a small number of bits and it maintains this fidelity as $\hat{L}$ varies over its range. In addition the computational requirements of this approach are well within the limits required for real-time implementation using a single DSP such as the AT&T DSP32C. Finally this quantization method separates the spectral amplitudes into a few components, such as the mean of the PRBA vector, which are sensitive to bit errors, and a large number of other components which are not very sensitive to bit errors. Forward error correction can then be used in an efficient manner by providing a high degree of protection for the few sensitive components and a lesser degree of protection for the remaining components. This is discussed in the next section.

SUMMARY OF THE INVENTION

In a first aspect, the invention features an improved method for error correction (or error detection) coding of the speech model parameters. The new method uses at least two types of error correction coding to code the quantized model parameters. A first type of coding, which adds a greater number of additional bits than a second type of coding, is used for a group of parameters that is more sensitive to bit errors. The other type of error correction coding is used for a second group of parameters that is less sensitive to bit errors than the first. Compared to existing methods, the new method improves the quality of the synthesized speech in the presence of bit errors while reducing the amount of additional error correction or detection bits which must be added. In preferred embodiments, the different types of error correction include Golay codes and Hamming codes.

In a second aspect, the invention features a further method for improving the quality of synthesized speech in the presence of bit errors. The error rate is estimated from the error correction coding, and one or more model parameters from a previous segment are repeated in a current segment when the error rate for the parameters exceeds a predetermined level. In preferred embodiments, all of the model parameters are repeated.

In a third aspect, the invention features a new method for reducing the degradation caused by the estimation and quantization of the model parameters. This new method uses a frequency domain representation of the spectral envelope parameters to enhance regions of the spectrum which are perceptually important and to attenuate regions of the spectrum which are perceptually insignificant. The result is that degradation in the synthesized speech is reduced. A smoothed spectral envelope of the segment is generated by smoothing the spectral envelope, and an enhanced spectral envelope is generated by increasing some frequency regions of the spectral envelope for which the spectral envelope has greater amplitude than the smoothed envelope and decreasing some frequency regions for which the spectral envelope has lesser amplitude than the smoothed envelope. In preferred embodiments, the smoothed spectral envelope is generated by estimating a low-order model (e.g. an all-pole model) from the spectral envelope. Compared to existing methods this new method is more computationally efficient for frequency domain speech coders. In addition this new method improves speech quality by removing the frequency domain constraints imposed by time-domain methods.

Other features and advantages of the invention will be apparent from the following description of preferred embodiments and from the claims.

DESCRIPTION OF PREFERRED EMBODIMENTS OF THE INVENTION

Figure 1:
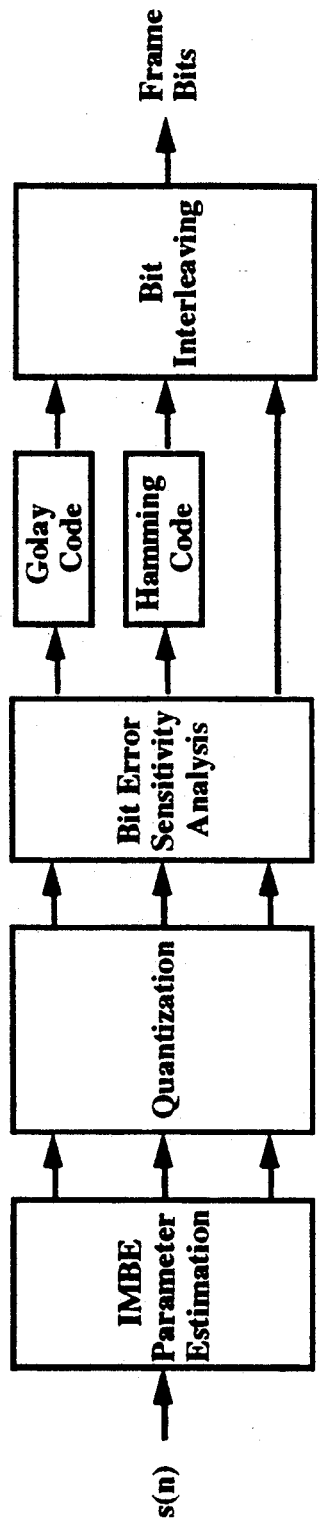
FIG. 1 is a flow chart showing a preferred embodiment of the invention encoder in which different error correction codes are used for different model parameter bits.
Figure 2:
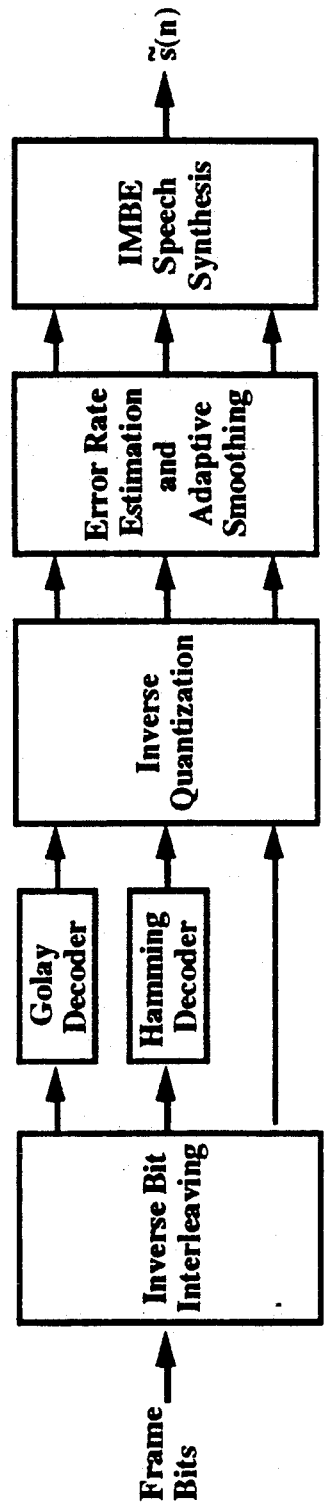
FIG. 2 is a flow chart showing a preferred embodiment of the invention decoder in which different error correction codes are used for different model parameter bits.
Figure 3:
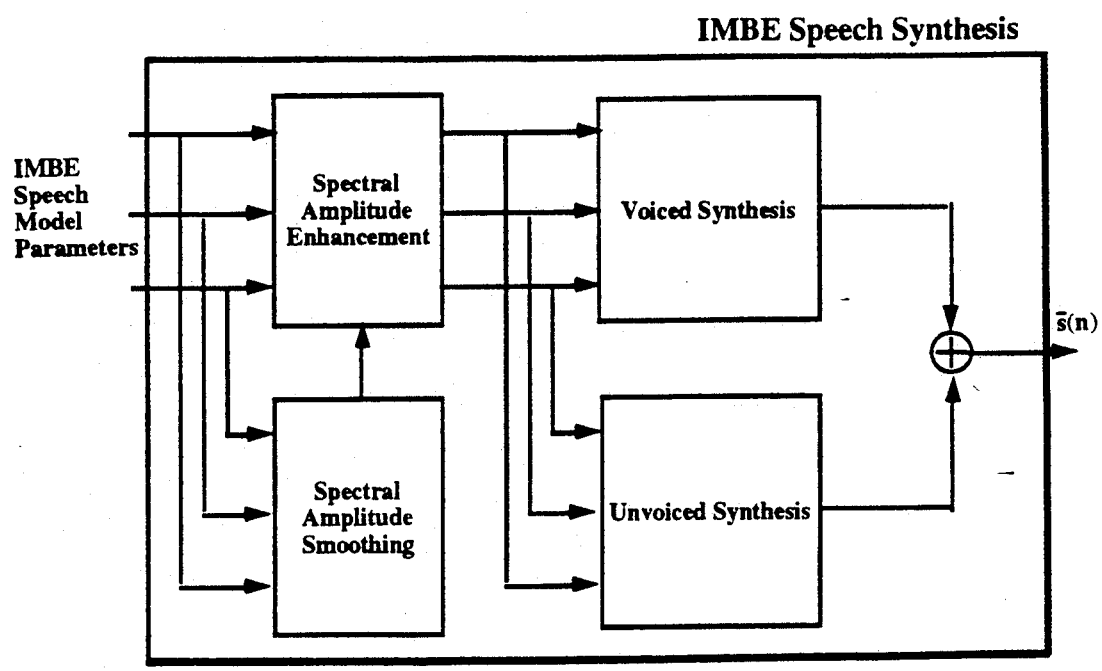
FIG. 3 is a flow chart showing a preferred embodiment of the invention in which frequency domain spectral envelope parameter enhancement is depicted.

In our invention we divide the quantized speech model parameter bits into three or more different groups according to their sensitivity to bit errors, and then we use different error correction or detection codes for each group. Typically the group of data bits which is determined to be most sensitive to bit errors is protected using very effective error correction codes. Less effective error correction or detection codes, which require fewer additional bits, are used to protect the less sensitive data bits. This new method allows the amount of error correction or detection given to each group to be matched to its sensitivity to bit errors. Compared to the prior art, this method has the advantage that the degradation caused by bit errors is reduced and the number of bits required for forward error correction is also reduced.

The particular choice of error correction or detection codes which is used depends upon the bit error statistics of the transmission or storage medium and the desired bit rate. The most sensitive group of bits is typically protected with an effective error correction code such as a Hamming code, a BCH code, a Golay code or a Reed-Solomon code. Less sensitive groups of data bits may use these codes or an error detection code. Finally the least sensitive groups may use error correction or detection codes or they may not use any form of error correction or detection. The invention is described herein using a particular choice of error correction and detection codes which was well suited to a 6.4 kbps IMBE speech coder for satellite communications.

In the 6.4 kbps IMBE speech coder, which was standardized for the INMARSAT-M satellite communciation system, the 45 bits per frame which are reserved for forward error correction are divided among [23,12] Golay codes which can correct up to 3 errors, [15,11] Hamming codes which can correct single errors and parity bits. The six most significant bits from the fundamental frequency and the three most significant bits from the mean of the PRBA vector are first combined with three parity check bits and then encoded in a [23,12] Golay code. A second Golay code is used to encode the three most significant bits from the PRBA vector and the nine most sensitive bits from the higher order DCT coefficients. All of the remaining bits except the seven least sensitive bits are then encoded into five [15,11] Hamming codes. The seven least significant bits are not protected with error correction codes.

Prior to transmission the 128 bits which represent a particular speech segment are interleaved such that at least five bits separate any two bits from the same code word. This feature spreads the effect of short burst errors over several different codewords, thereby increasing the probability that the errors can be corrected.

At the decoder the received bits are passed through Golay and Hamming decoders which attempt to remove any bit errors from the data bits. The three parity check bits are checked and if no uncorrectable bit errors are detected then the received bits are used to reconstruct the MBE model parameters for the current frame. Otherwise if an uncorrectable bit error is detected then the received bits for the current frame are ignored and the model parameters from the previous frame are repeated for the current frame.

The use of frame repeats has been found to improve the perceptual quality of the speech when bit errors are present. The invention examines each frame of received bits and determines whether the current frame is likely to contain a large number of uncorrectable bit errors. One method used to detect uncorrectable bit errors is to check extra parity bits which are inserted in the data. The invention also determines whether a large burst of bits errors has been encountered by comparing the number of correctable bit errors with the local estimate of the error rate. If the number of correctable bit errors is substantially greater than the local estimate of the error rate then a frame repeat is performed. Additionally, the invention checks each frame for invalid bit sequences (i.e. groups of bits which the encoder never transmits). If an invalid bit sequence is detected a frame repeat is performed.

The Golay and Hamming decoders also provide information on the number of correctable bit errors in the data. This information is used by the decoder to estimate the bit error rate. The estimate of the bit error rate is used to control adaptive smoothers which increase the perceived speech quality in the presence of uncorrectable bit errors. In addition the estimate of the error rate can be used to perform frame repeats in bad error environments.

This aspect of the invention can be used with soft-decision coding to further improve performance. Soft-decision decoding uses additional information on the likelihood of each bit being in error to improve the error correction and detection capabilities of many different codes. Since this additional information is often available from a demodulator in a digital communication system, it can provide improved robustness to bit errors without requiring additional bits for error protection.

The invention uses a new frequency domain parameter enhancement method which improves the quality of synthesized speech. The invention first locates the perceptually important regions of the speech spectrum. The invention then increases the amplitude of the perceptually important frequency regions relative to other frequency regions. The preferred method for performing frequency domain parameter enhancement is to smooth the spectral envelope to estimate the general shape of the spectrum. The spectrum can be smoothed by fitting a low-order model such as an all-pole model, a cepstral model, or a polynomial model to the spectral envelope. The smoothed spectral envelope is then compared against the unsmoothed spectral envelope and perceptually important spectral regions are identified as regions where the unsmoothed spectral envelope has greater energy than the smoothed spectral envelope. Similarly regions where the unsmoothed spectral envelope has less energy than the smoothed spectral envelope are identified as perceptually less important. Parameter enhancement is performed by increasing the amplitude of perceptually important frequency regions and decreasing the amplitude of perceptually less important frequency regions. This new enhancement method increases speech quality by eliminating or reducing many of the artifacts which are introduced during the estimation and quantization of the speech parameters. In addition this new method improves the speech intelligibility by sharpening the perceptually important speech formants.

In the IMBE speech decoder a first-order all-pole model is fit to the spectral envelope for each frame. This is done by estimating the correlation parameters, $R_0$ and $R_1$ from the decoded model parameters according to the following equations, $$R_0 = \sum_{l=1}^{\hat{L}} \hat{M}_l^2 \tag{3}$$

$$R_1 = \sum_{l=1}^{\hat{L}} \hat{M}_l^2 \cos(\hat{\omega}_0 l) \tag{4}$$

where $\hat{M}_l$ for $1 \leq l \leq \hat{L}$ are the decoded spectral amplitudes for the current frame, and $\hat{\omega}_0$ is the decoded fundamental frequency for the current frame. The correlation parameters $R_0$ and $R_1$ can be used to estimate a first-order all-pole model. This model is evaluated at the frequencies corresponding to the spectral amplitudes for the current frame (i.e. $k \cdot \hat{\omega}_0$ for $1 \leq l \leq \hat{L}$) and used to generate a set of weights $W_l$ according to the following formula.

$$W_l = \sqrt{\hat{M}_l} \cdot \left[ \frac{.96\pi(R_0^2 + R_1^2 - 2R_0 R_1 \cos(\hat{\omega}_0 l))}{\hat{\omega}_0 R_0 (R_0^2 - R_1^2)} \right]^{\frac{1}{4}} \tag{5}$$

for $1 \leq l \leq \hat{L}$

These weights indicate the ratio of the smoothed all-pole spectrum to the IMBE spectral amplitudes. They are then used to individually control the amount of parameter enhancement which is applied to each spectral amplitude. This relationship is expressed in the following equation, $$\tilde{M}_l = \begin{cases} 1.2 \cdot \hat{M}_l & \text{if } W_l > 1.2 \\ W_l \cdot \hat{M}_l & \text{otherwise} \end{cases} \quad \text{for } 1 \leq l \leq \hat{L} \tag{6}$$

where $\tilde{M}_l$ for $1 \leq l \leq \hat{L}$ are the enhanced spectral amplitudes for the current frame.

The enhanced spectral amplitudes are then used to perform speech synthesis. The use of the enhanced model parameters improves speech quality relative to synthesis from the unenhanced model parameters.

We claim:

1. A method of encoding speech wherein the speech is encoded using a speech model characterized by model parameters, wherein the speech is broken into time segments and for each segment model parameters are estimated and quantized, and wherein at least some of the quantized model parameters are coded using error correction coding, said method comprising the steps of:

using a first type of error correction coding to code the quantized model parameters in a first group, using a second type of error correction coding to code the quantized model parameters in a second group, the first group containing quantized model parameters that are more sensitive to bit errors than are the quantized model parameters in the second group, the first type of error correction coding adding a greater number of additional bits than the second type of error correction coding.

2. The method of claim 1 wherein the first and second types of error correction coding are Golay codes and Hamming codes, respectively.

3. The method of claim 1 or 2 wherein soft decision decoding is employed in decoding at least one of the groups of quantized model parameters.

4. The method of claim 1 or 2 wherein error rates are estimated using the error correction codes.

5. The method of claim 4 wherein one or more model parameters are smoothed across a plurality of segments based on estimated error rates, and wherein said model parameters have values.

6. The method of claim 5 wherein the model parameters smoothed include voiced/unvoiced decisions.

7. The method of claim 5 wherein the model parameters smoothed include parameters for at least one of the following speech coders: Multi-Band Excitation (MBE) speech coder, Improved Multi-Band Excitation (IMBE) speech coder, or sinusoidal transform speech coder (STC).

8. The method of claim 5 wherein the value of one or more model parameters in a previous segment is repeated in a current segment when the estimated error rate for the parameters exceeds a predetermined level.

9. A method of encoding speech wherein the speech is encoded using a speech model characterized by model parameters, wherein the speech is broken into time segments and for each segment model parameters are estimated and quantized, and wherein at least some of the quantized model parameters are coded using error correction coding, and wherein speech is synthesized from decoded quantized model parameters, said method comprising the steps of:
using the error correction coding during synthesis to estimate an error rate,
repeating in a current segment one or more model parameters from a previous segment when the error rate for the quantized model parameters exceeds a predetermined level.

10. The method of claim 1, 2 or 9 wherein the quantized speech model parameters are those associated with at least one of the following speech coders: a Multi-Band Excitation (MBE) speech coder, an Improved Multi-Band Excitation (IMBE) speech coder, a linear prediction speech coder, a channel speech coder, a homomorphic speech coder, a sinusoidal transform speech coder (STC), and a code-excited linear prediction (CELP) speech coder.

11. A method of decoding speech wherein the speech is decoded and synthesized using a speech model characterized by model parameters, wherein the model parameters have been quantized and encoded, and wherein at least some of the quantized model parameters are decoded using error correction decoding, said method comprising the steps of:
using a first type of error correction decoding to decode the quantized model parameters in a first group,
using a second type of error correction decoding to decode the quantized model parameters in a second group,
the first group containing quantized model parameters that are more sensitive to bit errors than are the quantized model parameters in the second group,
the first type of decoding utilizing a greater number of additional bits than the second type of decoding.

12. The method of claim 11 wherein the first and second types of error correction decoding are Golay code decoding and Hamming code decoding, respectively.

13. The method of claim 11 or 12 wherein the quantized speech model parameters are those associated with at least one of the following speech coders: a Multi-Band Excitation (MBE) speech coder, an Improved Multi-Band Excitation (IMBE) speech coder, a linear prediction speech coder, a channel speech coder, a homomorphic speech coder, a sinusoidal transform speech coder (STC), and a code-excited linear prediction (CELP) speech coder.

14. A method of enhancing speech wherein a speech signal is broken into segments, and wherein frequency domain representations of a segment is determined to provide an unsmoothed spectral envelope of the segment, and speech is synthesized from an enhanced spectral envelope, said method comprising the steps of:
smoothing the unsmoothed spectral envelope of the segment to generate a smoothed spectral envelope
generating the enhanced spectral envelope by increasing the amplitude of the smoothed spectral envelope in at least some frequency regions for which the unsmoothed spectral envelope has greater amplitude than the smoothed spectral envelope, and
decreasing the amplitude of the smoothed spectral envelope in at least some frequency regions for which the unsmoothed spectral envelope has lesser amplitude than the smoothed spectral envelope,
thereby generating an enhanced spectral envelope in which the amplitudes in some regions are increased above the amplitudes of the smoothed spectral envelope and the amplitudes in other regions are decreased below the amplitudes of the smoothed spectral envelope.

15. The method of claim 14 wherein the frequency domain representation of the unsmoothed spectral envelope is the set of spectral amplitudes forming parameters of at least one of the following speech coders: Multi-Band Excitation (MBE) speech coder, Improved Multi-Band Excitation (IMBE) speech coder, or sinusoidal transform speech coder (STC).

16. The method of claim 14 or 15 wherein the smoothed spectral envelope is generated by estimating a low-order model from the unsmoothed spectral envelope.

17. The method of claim 16 wherein the low-order model is one of the following models: an all-pole model, a cepstral model, or a polynomial model.

18. The method of claim 14 or 15 wherein the smoothed spectral envelope is generated by convolving the unsmoothed spectral envelope with a smoothing function.

* * * * *